United States Patent
Lee et al.

(10) Patent No.: US 6,949,837 B2
(45) Date of Patent: Sep. 27, 2005

(54) BONDING PAD ARRANGEMENT METHOD FOR SEMICONDUCTOR DEVICES

(75) Inventors: Ho-Cheol Lee, Yongin-shi (KR); Jae-Hoon Kim, Suwon-shi (KR); Jung-Su Ryu, Seongnam-shi (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 40 days.

(21) Appl. No.: 10/465,554

(22) Filed: Jun. 20, 2003

(65) Prior Publication Data

US 2004/0000726 A1 Jan. 1, 2004

(30) Foreign Application Priority Data

Jun. 26, 2002 (KR) .................................. 10-2002-0035925

(51) Int. Cl.[7] .......................... H01L 23/50; H01L 23/48
(52) U.S. Cl. ...................... 257/784; 257/786; 257/773; 257/730; 257/775; 257/776; 257/777; 257/696; 257/691; 257/698; 257/674; 29/827
(58) Field of Search .................................. 257/784, 786, 257/776, 775, 666, 676, 669–672, 674, 698, 691, 730; 29/827

(56) References Cited

U.S. PATENT DOCUMENTS

| | | | | | |
|---|---|---|---|---|---|
| 5,757,082 A | * | 5/1998 | Shibata | ....................... | 257/786 |
| 5,818,114 A | * | 10/1998 | Pendse et al. | .............. | 257/786 |
| 6,008,532 A | * | 12/1999 | Carichner | ................... | 257/691 |
| 6,303,948 B1 | * | 10/2001 | Kudou et al. | ............... | 257/207 |

FOREIGN PATENT DOCUMENTS

| | | | | |
|---|---|---|---|---|
| JP | 03-109747 | | 5/1991 | |
| JP | 05-074844 | | 3/1993 | |
| JP | 6-37131 | * | 2/1994 | ................. 357/668 |
| JP | 8-330351 | * | 12/1996 | |
| JP | 10-74786 | * | 3/1998 | |

* cited by examiner

Primary Examiner—Alexander Oscar Williams
(74) Attorney, Agent, or Firm—Harness, Dickey & Pierce, P.L.C.

(57) ABSTRACT

A variety of pad arrangements are provided for semiconductor devices for reducing the likelihood of bonding failures, particularly those due to shorts, and/or for reducing the difference in length between bonding wires to decrease signal skew during operation of the semiconductor device and improve signal integrity.

18 Claims, 14 Drawing Sheets

<ONE-ROW ARRANGEMENT>

<TWO-ROW ARRANGEMENT>

<EDGE ARRANGEMENT>

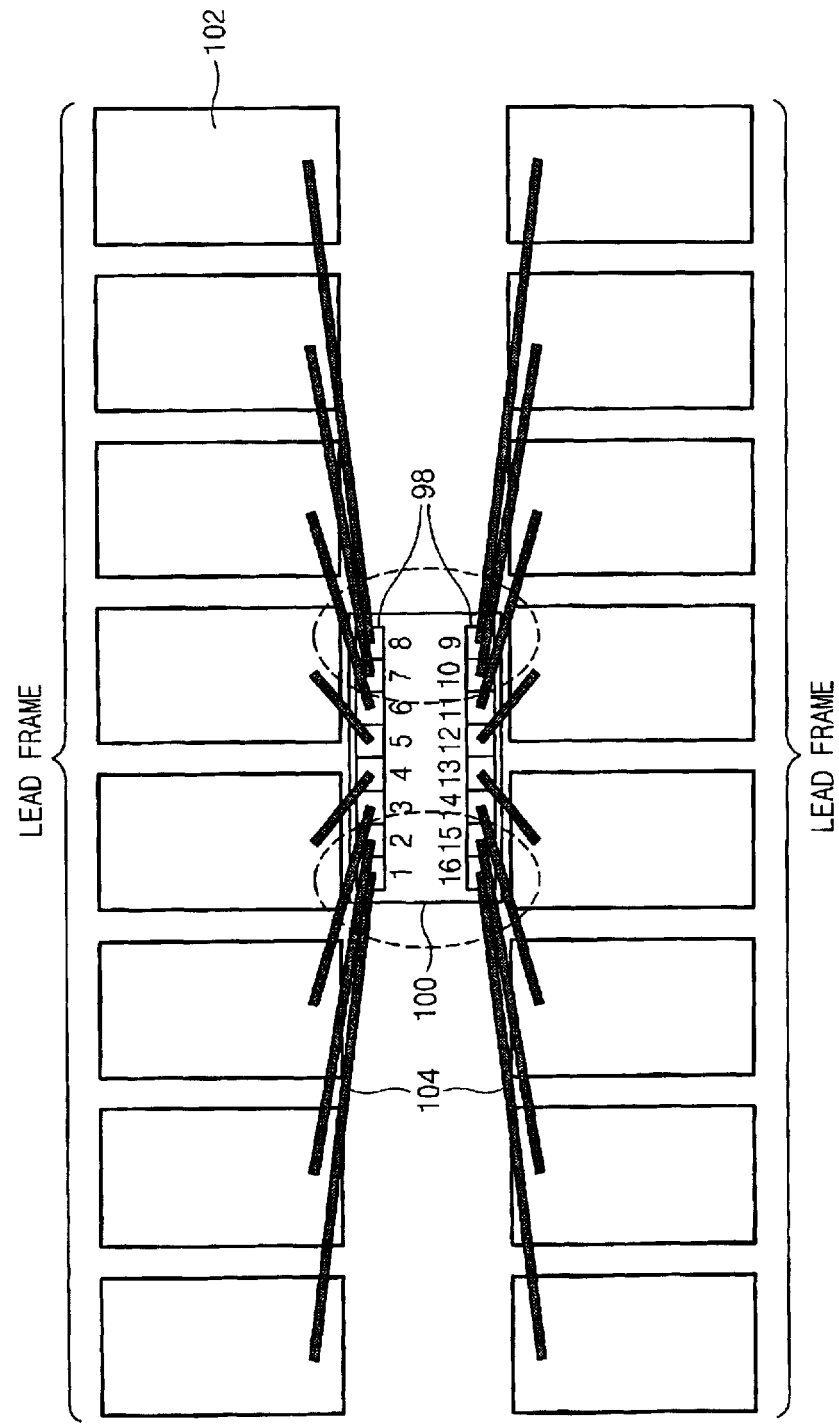

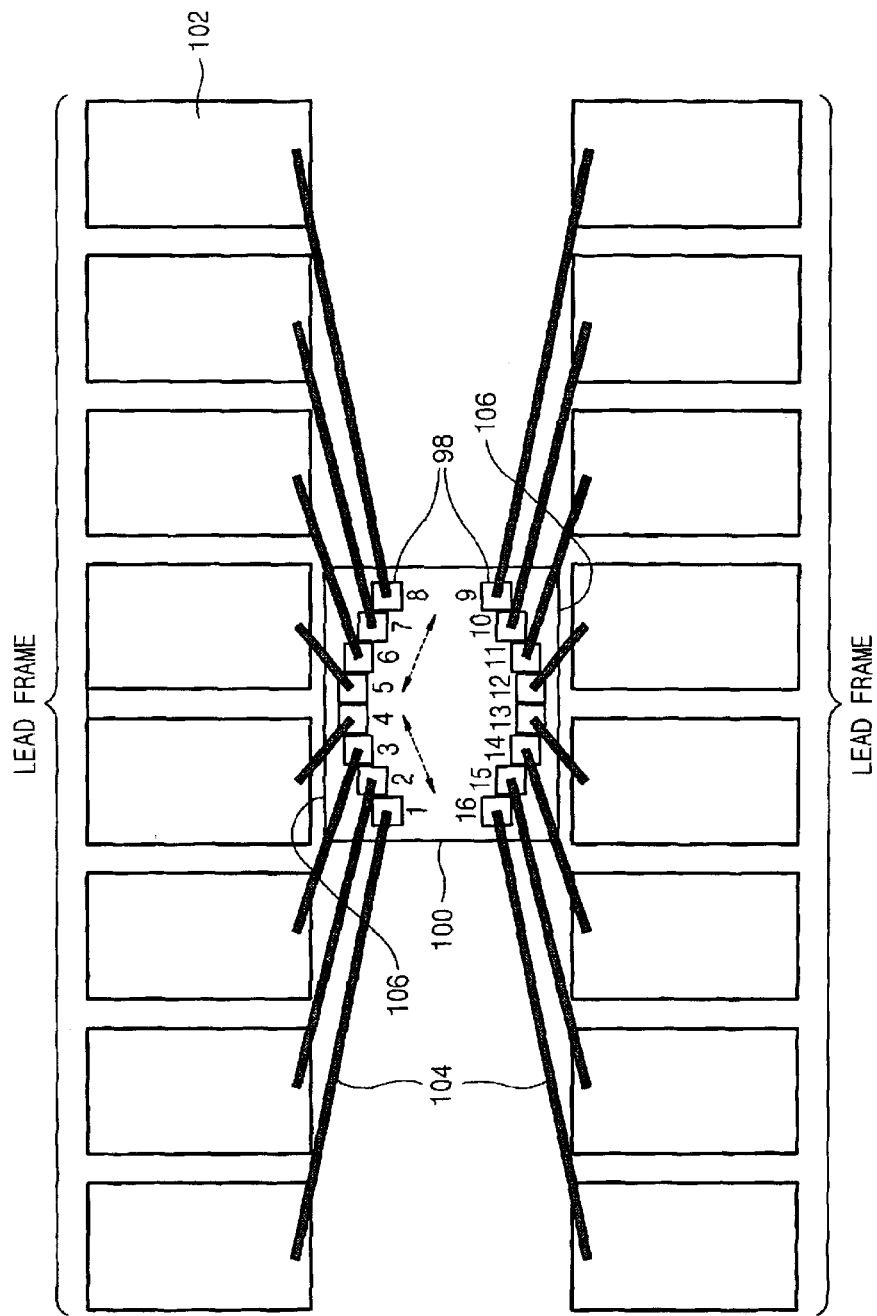

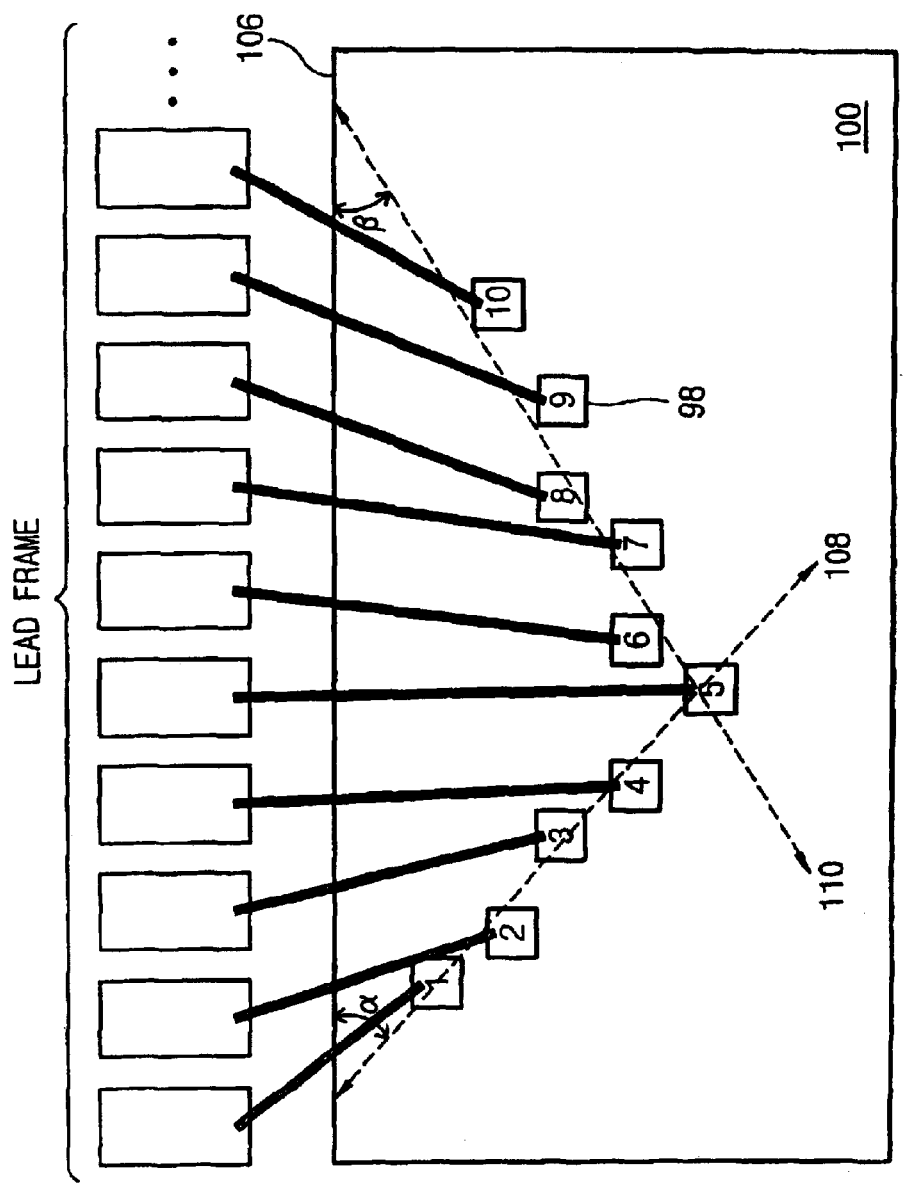

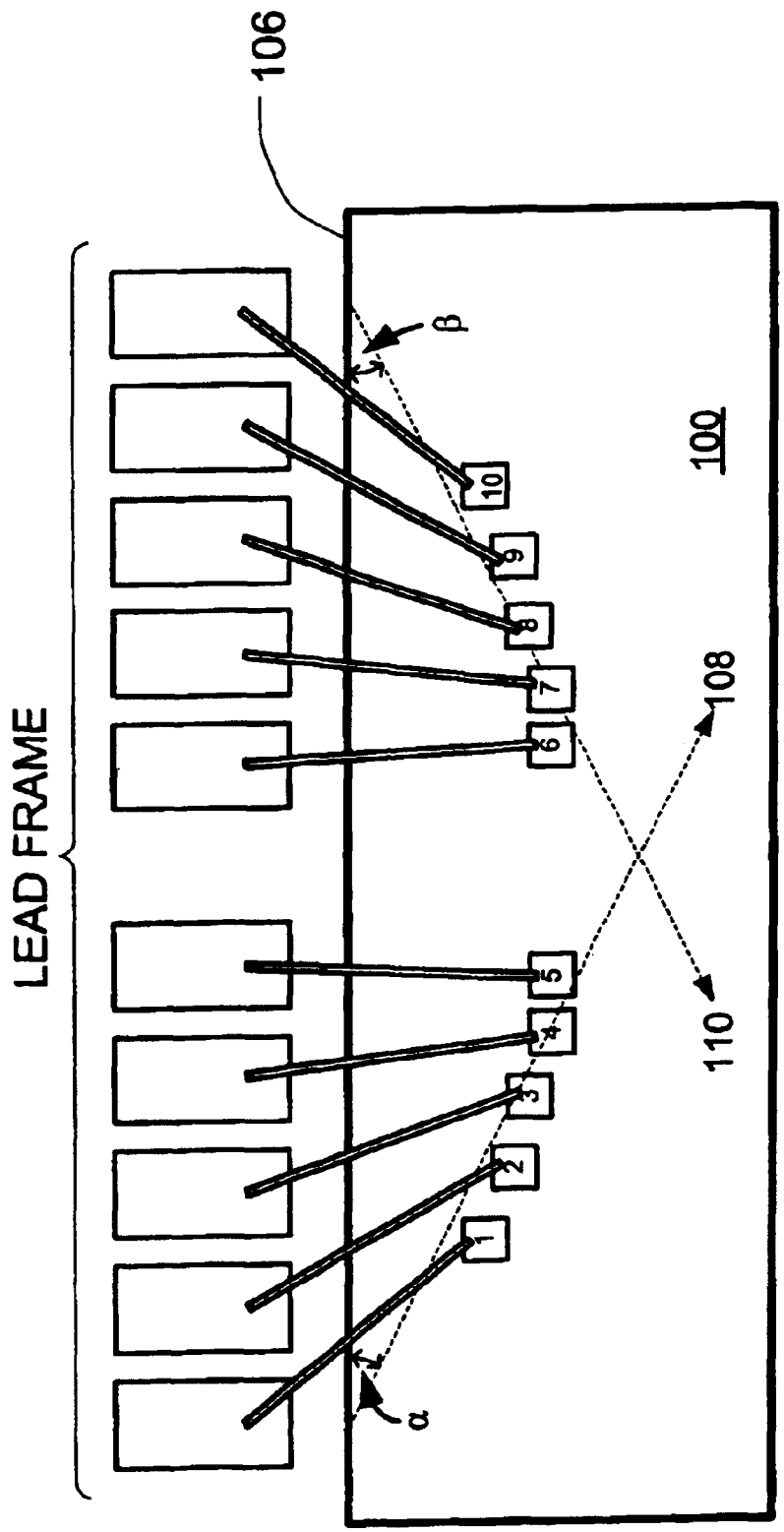

US 6,949,837 B2

BONDING PAD ARRANGEMENT METHOD FOR SEMICONDUCTOR DEVICES

This U.S. nonprovisional patent application claims priority under 35 U.S.C. § 119 of Korean Patent Application 2002-35925 filed on Jun. 26, 2002, the entire contents of which are hereby incorporated by reference.

BACKGROUND OF THE INVENTION

1. Field of the Invention

The present invention relates to a semiconductor device and, more particularly, to pad arrangements for reducing bonding failures and signal skew.

2. Discussion of the Related Art

As semiconductor manufacturing processes have improved, design rules have been reduced to allow for smaller and/or higher density semiconductor devices. However, for semiconductor devices having a large number of pads, the pad pitch limit, or pad-to-pad design rule, may define the minimum size.

FIGS. 1A to 1C are views of representative pad arrangements that are used on conventional semiconductor devices. FIG. 1A illustrates pads 98 arranged in a single row on a chip 100, FIG. 1B illustrates pads 98 arranged in two rows on a chip 100 and FIG. 1C illustrates pads 98 arranged around the periphery of a chip 100. FIG. 2 illustrates a conventional configuration of bonding wires 104 used to connect two rows of bond pads to the corresponding portions of a lead frame 102. As reflected in FIG. 2, the separation between the bonding wires 104 used to connect pads 1–3, 6–11 and 14–16 to the corresponding portions of the lead frame 102 is reduced, increasing the likelihood that one or more shorts may be formed between a bond wire and a pad and/or an adjacent bond wire. Increasing the number of bond pads tends to reduce the spacing between adjacent bond wires and to increase the likelihood of shorts. Further, bonding wires 104 connected between the more distant portions of the lead frame 102 and certain of the pads, e.g., pads 1, 8, 9 and 16, are substantially longer than those bonding wires connected between closer portions of the lead frame and other pads, e.g., pads 4, 5, 12 and 13. Different bonding wire lengths may result in a timing skew between the signals being transmitted through the bonding wires to the respective pads. These timing skews will tend to compromise signal integrity, disrupt high-speed operations and limit the rate at which the semiconductor device may be successfully operated.

SUMMARY OF THE INVENTION

Accordingly, exemplary embodiments of the invention are directed to a method of arranging pads on a semiconductor device in a manner that will tend to reduce the likelihood of shorts and/or reduce the signal time skew during operation of the semiconductor device.

Exemplary embodiments of the invention are directed to methods of arranging pads on semiconductor devices to allow a plurality of bonding wires to have substantially the same length.

Exemplary embodiments of the invention provide methods of arranging pads, such as pad-on-cell (POC) type pads, on semiconductor devices to form pad groupings having an oblique arrangement with respect to the chip edge and/or other pad groupings. Exemplary pad groupings configurations may be symmetrical or asymmetrical with respect to the chip edge and may include one or more V-shaped, sawtooth or zigzag-type pad arrangements that may allow reductions in the semiconductor package size, reduce the length variation in the bond wires, and reduce the likelihood of shorting between bonding wires and/or pads.

It is to be understood that both the foregoing general description and the following detailed description of the present invention are exemplary and explanatory and are intended to provide further explanation to those of skill in the art of the invention as claimed.

BRIEF DESCRIPTION OF THE DRAWINGS

Exemplary embodiments of the invention may be further understood through the written description and the accompanying FIGURES in which:

FIG. 2 is a view illustrating a bonding wire configuration between a conventional lead from and semiconductor device pads with an increased likelihood of shorting or bonding failures;

FIG. 3 is a plan view showing a pad arrangement in which lead frames are bonded with pads in accordance with a first exemplary embodiment of the invention;

FIG. 7A is a plan view of a pad arrangement in accordance with a fifth exemplary embodiment of the invention, FIG. 7C is a plan view of a pad arrangement in which the bonding wire have substantially equal lengths;

DETAILED DESCRIPTION OF THE INVENTION

Figure 1A:
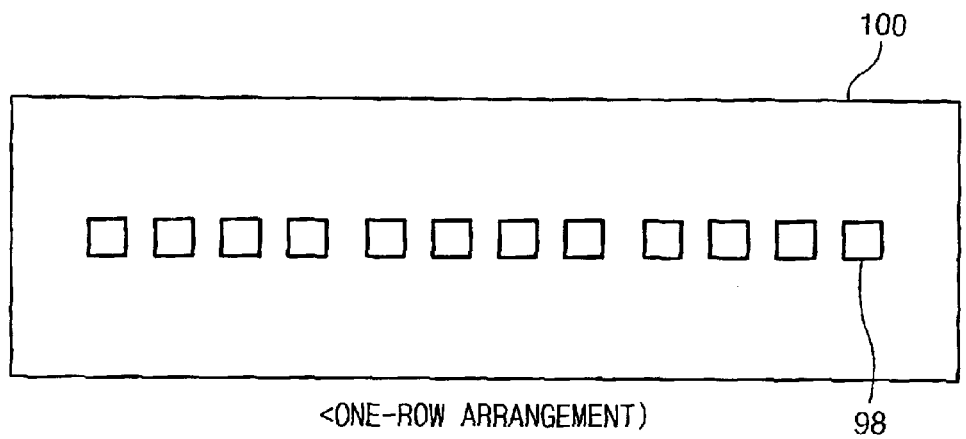
FIGS. 1A to 1C are plan views illustrating certain conventional pad arrangements.
Figure 1B:
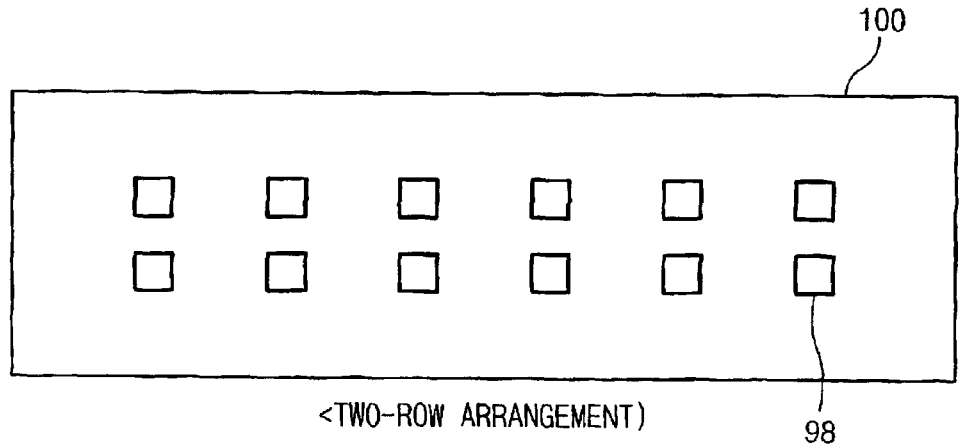
Figure 1C:
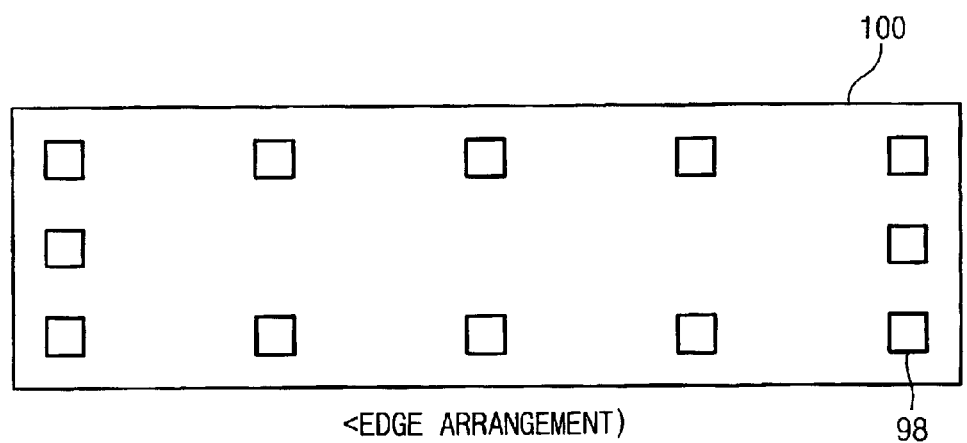

Exemplary embodiments of the invention will be described below with reference to accompanying drawings. This invention may, however, be embodied in many different forms and should not be construed as being limited to the exemplary embodiments set forth herein; rather, these exemplary embodiments are provided so that this disclosure is thorough and complete, and conveys the concept of the invention to those skilled in the art. In the drawings, the sizing and spacing of elements may be enlarged or reduced for clarity and are not intended to be to scale.

FIG. 3 is a plan view showing an arrangement of pads 1–16 on a semiconductor chip 100 according to a first exemplary embodiment of the invention with portions of a conventional lead frame 102 being connected to the pads with bonding wires 104. As illustrated in FIG. 3, pads 1–8 and 9–12 are arranged to form two shallow "V" shapes having legs arranged obliquely with respect to one of the edges 106 of chip 100. As illustrated in FIG. 3, this arrangement of the pads allows the bonding wires 104 between the several end pads on each leg of the "V" shape, i.e., pads 1–3, 6–8, 9–11 and 14–16 to be bonded to a conventional lead frame 102 while improving the separation between adjacent bonding wires and the overlap of other pads to reduce the likelihood of shorting. Increasing the oblique angle between a group of pads and the edge of the chip can increase the number of pads that may be successfully bonded to the lead frame and permit the mounting of semiconductor devices having an increased number of pads.

Figure 4:
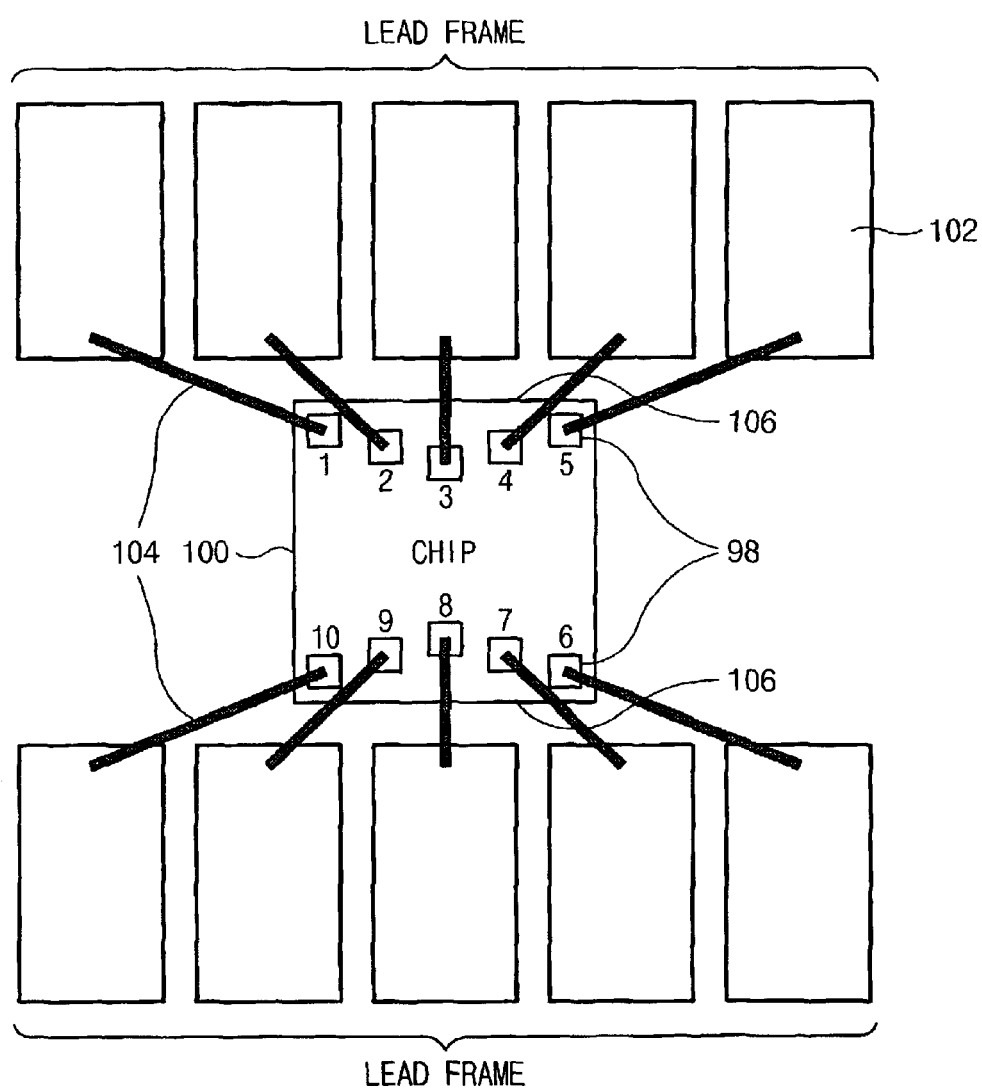
FIG. 4 is a plan view showing a pad arrangement in which lead frames are bonded with pads in accordance with a second exemplary embodiment of the invention.

FIG. 4 is a plan view showing an arrangement of pads 1–10 on a semiconductor chip 100 according to a second exemplary embodiment of the invention with portions of a conventional lead frame 102 being connected to the pads with bonding wires 104. As illustrated in FIG. 4, pads 1–5 and 6–10 are arranged in opposing "V" shapes configured to allow connection to a conventional lead frame 102 using bonding wires 104 of substantially equal length. By allowing the use of bonding wires of substantially equal length, this pad arrangement reduces signal skew and improves signal integrity.

Figure 5:
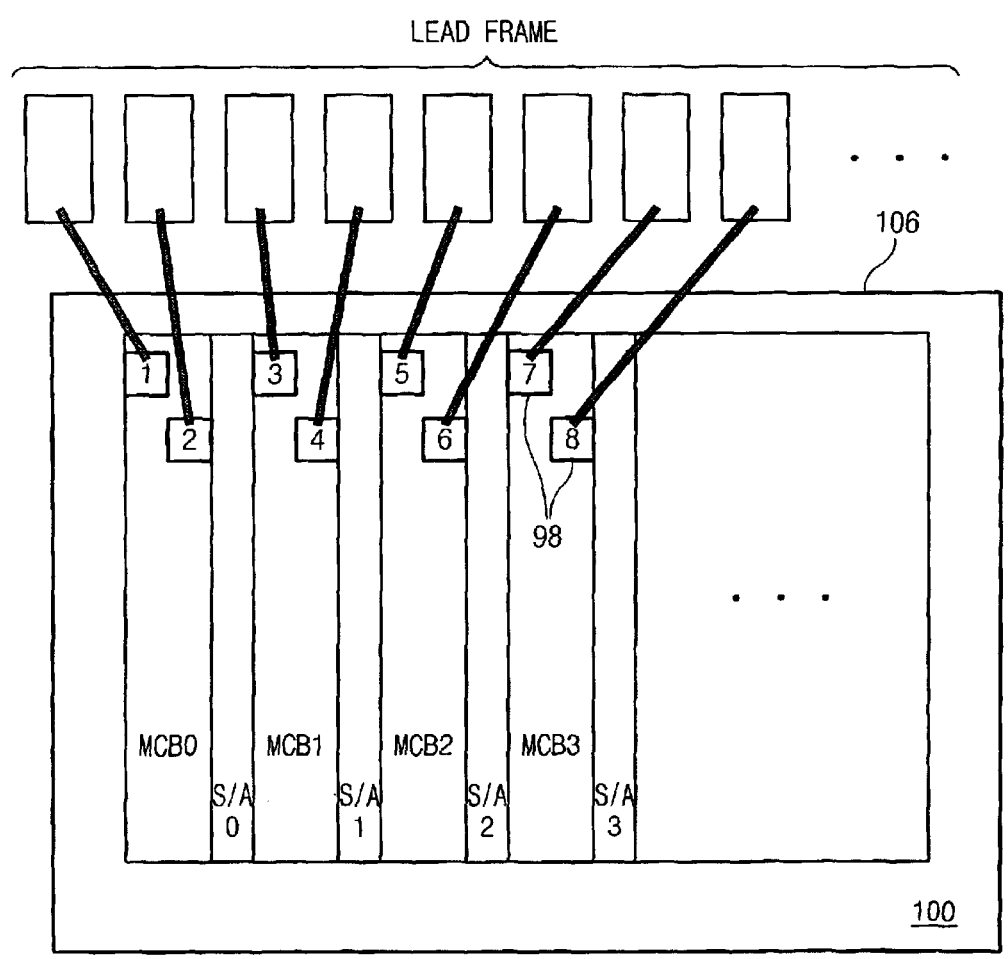
FIG. 5 is a plan view of a pad arrangement in accordance with a third exemplary embodiment of the invention.

FIG. 5 is a plan view of a pad arrangement in accordance with a third exemplary embodiment of the invention. As illustrated in FIG. 5, a plurality of memory cell array blocks, including memory cell array blocks MCB0 to MCB3, and sense amplifiers, including S/A0 to S/A3, are provided on a semiconductor chip 100. Each of the memory cell array blocks is associated with a pair of pads, including pads 1–10, which may be POC-type pads. The pads in each memory cell array block are offset in such a manner that the first pads in each of the memory cell array blocks are arranged in a first line and the second pads in each of the memory cell array blocks are arranged in a second line, the first and second lines being substantially parallel to each other and to the edge 106 of the chip 100. The offset between the pads and the step distance between adjacent memory cell array blocks may be such that a line from a first pad to a second pad to the next first pad, e.g., from pad 1 to pad 2 to pad 3, etc., will have a somewhat zigzag or sawtooth pattern. Offsetting the pads in each of the memory cell array blocks in this manner increases the number of pads that can be successfully bonded to a lead frame when compared with pads arranged in a single row.

Figure 6A:
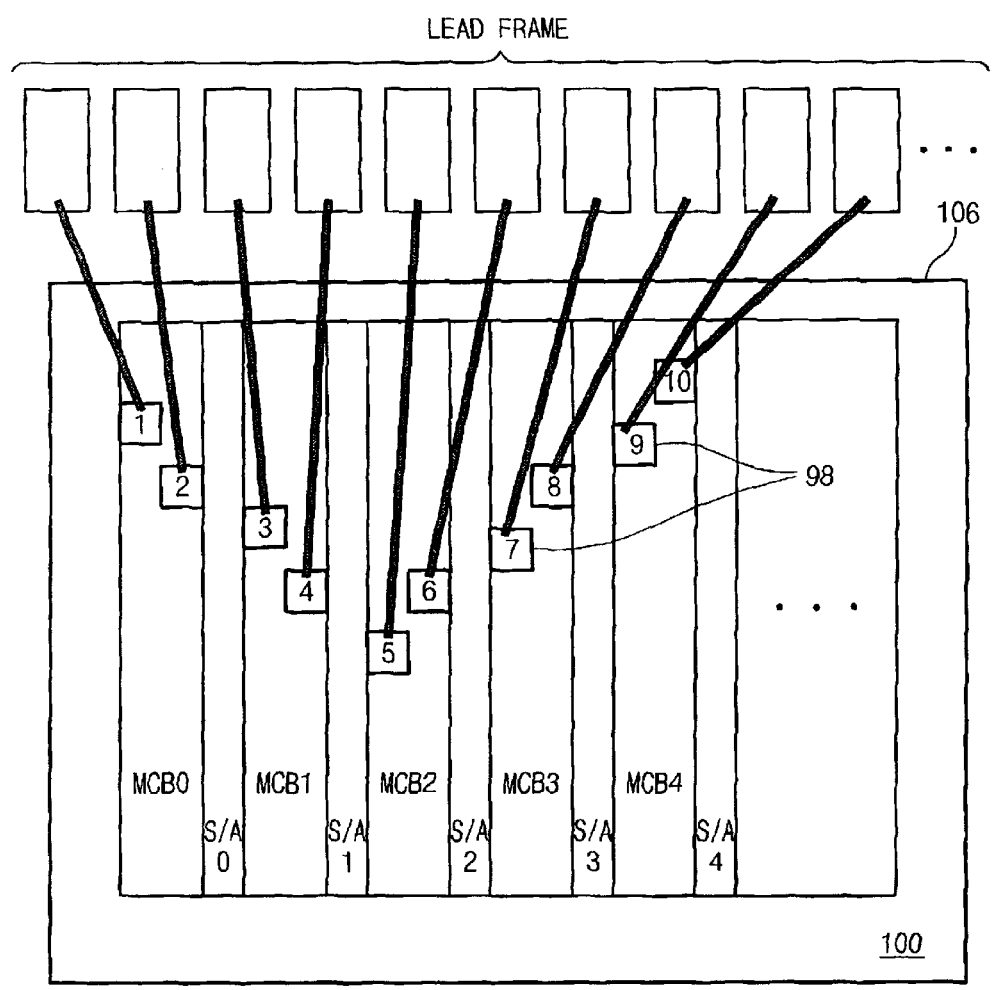
FIGS. 6A and 6B are plan views of pad arrangements in accordance with a fourth exemplary embodiment of the invention.
Figure 6B:
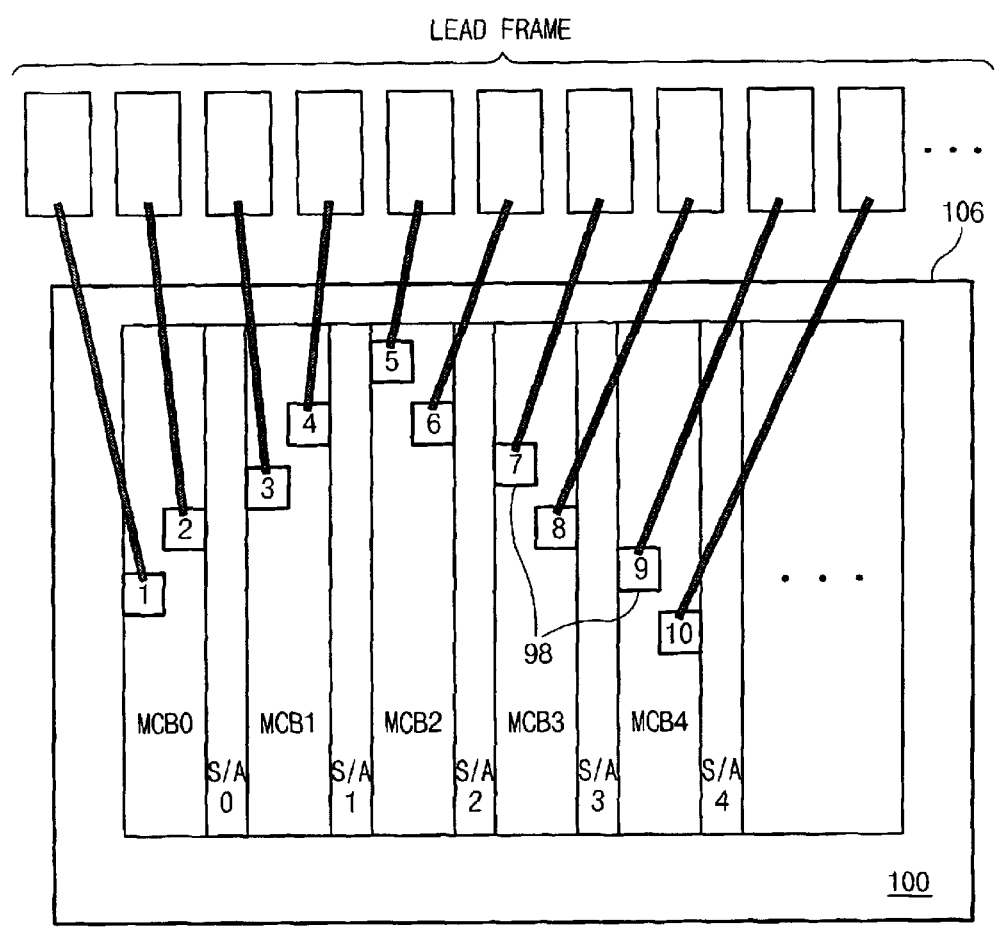

FIGS. 6A and 6B are plan views of pad arrangements in accordance with a fourth exemplary embodiment of the present invention. As illustrated in FIG. 6A, pads 1–10, which may be POC-type pads, are arranged on a semiconductor chip 100 over a plurality of memory cell array blocks, MCB0 to MCB4, in a general "V" shape with the point of the "V" directed toward the center of the chip. As did the pad arrangement illustrated in FIG. 4, the V-shaped pad arrangement illustrated in FIG. 6A allows the lengths of the bonding wires 104 used to connect the pads 98 and a lead frame (not shown) to be substantially equal, reducing the incidence of signal skew and improving the signal integrity. As illustrated in FIG. 6B, the pads may also be arranged in a "V" shape in which the point of the "V" is directed away from the center toward the edge 106 of the chip 100. As it did in the exemplary embodiment illustrated in FIG. 3, this pad arrangement improves the separation between adjacent bonding wires, particularly for those pads at the ends of the legs of the "V," and will reduce the likelihood of shorting.

Figure 7B:
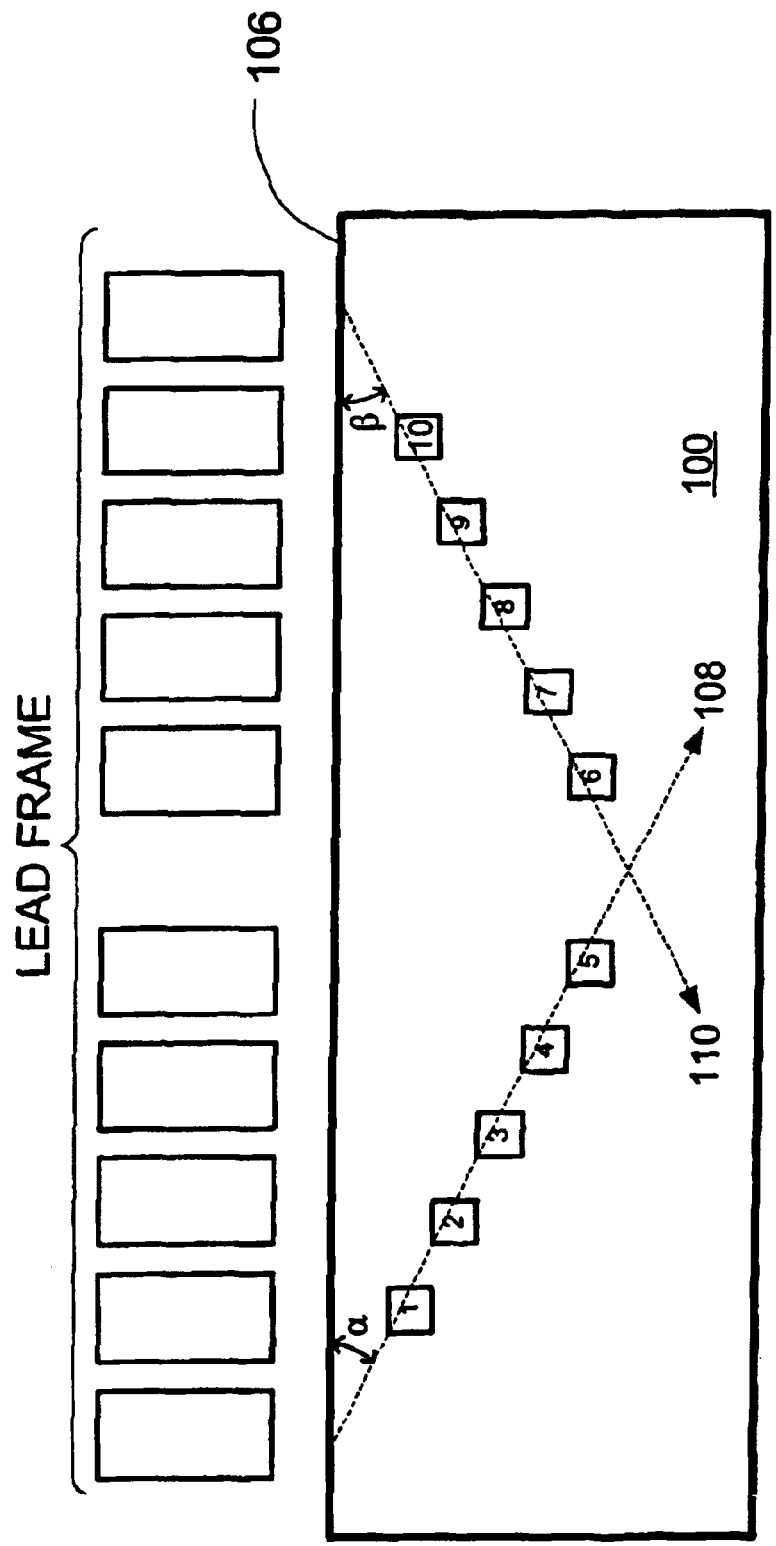
FIG. 7B is a plan view of a pad arrangement in which the angles α and β are substantially equal.

FIG. 7 is a plan view of a pad arrangement in accordance with a fifth exemplary embodiment of the present invention. As illustrated in FIG. 7, pads 1–10 are again arranged to form a somewhat asymmetric "V" shape. Pads 1–5 are generally aligned along a first line 108 defining a first oblique angle α with the edge 106 of chip 100. Similarly, pads 6–10 are generally aligned along a second line 110 defining a second oblique angle β with the edge 106 of chip 100. The selection of different angles α and β allows the pad arrangement to be adjusted to compensate for the off-center mounting of the chip 100 within a lead frame (not shown). In off-center mounting configurations, such as may be used in a multi-chip package, the selection of the angles α and β chips can improve the bonding performance by providing a larger effective angle for pads that are to be bonded to more distant portions of the lead frame while providing an angle that will tend to equalize the lengths of the bonding wires to pads that will be connected to closer portions of the lead frame.

Figure 8:
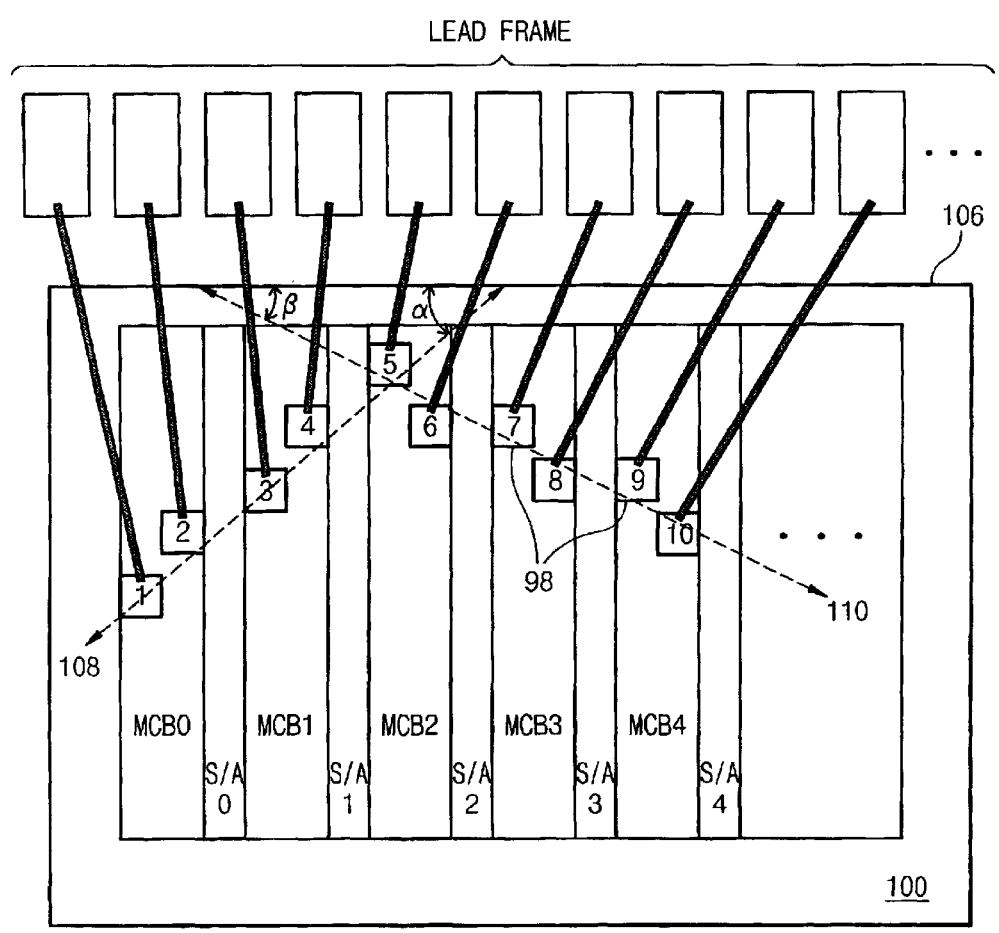
FIG. 8 is a plan view of a pad arrangement in accordance with a sixth exemplary embodiment of the invention.

FIG. 8 is a plan view of a pad arrangement in accordance with a sixth exemplary embodiment of the present invention. As illustrated in FIG. 8, pads 1 to 10 are arranged over memory cell array blocks MCB0 to MCB4 in an asymmetric "V" shape with pads 1–5 forming a first leg of the "V" and pads 6–10 forming the second leg. Like the pad arrangement illustrated in FIG. 7, the oblique angle α formed between a line 108 though pads 1 to 5 and the edge 106 of chip 100 is different than the angle β formed between a line 110 through pads 6–10 and the edge 106 of chip 100.

Figure 9:
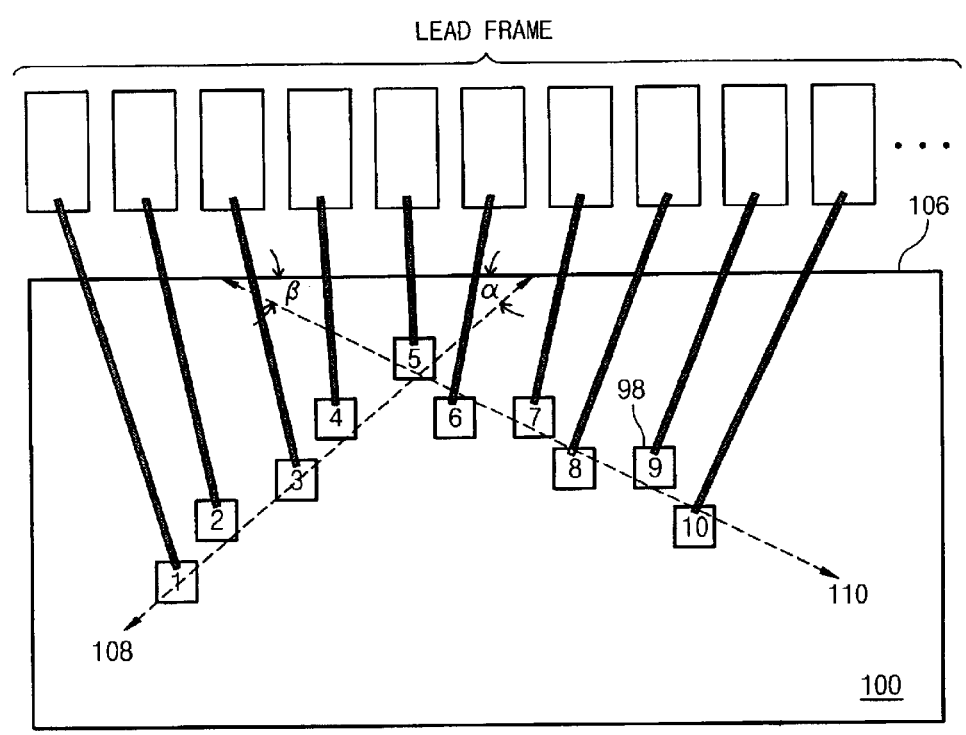
FIG. 9 is a plan view of a pad arrangement in accordance with a seventh exemplary embodiment of the present invention.
Figure 10:
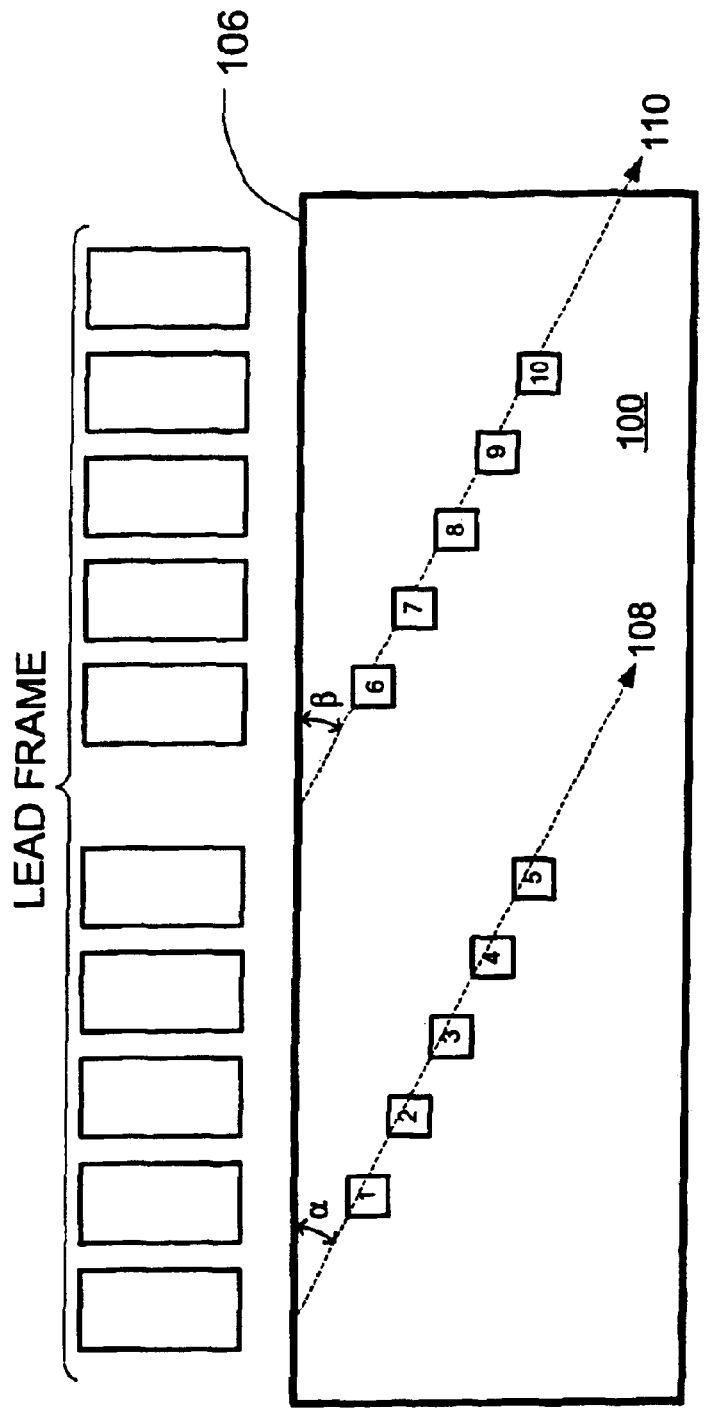
FIG. 10 is a plan view of an embodiment in which two series of pads are arranged with the corresponding axes being substantially parallel.

FIG. 9 is a plan view of a pad arrangement in accordance with a seventh exemplary embodiment of the present invention. The pad arrangement illustrated in FIG. 9 is substantially similar to the pad arrangement illustrated in FIG. 8, except that the pads of FIG. 9 are conventional pads arranged on a semiconductor substrate rather than POC-type pads. The reasons for and the benefits resulting from such a pad arrangement are similar to those discussed in connection with FIG. 8.

Pad arrangements in accord with the exemplary embodiments of the invention make it possible to reduce the occurrence of shorts between the bonding wires, the pads and/or the lead frame in a semiconductor package. Pad arrangements in accord with the exemplary embodiments of the invention may also make it possible to reduce the difference in the length of the bonding wires, thereby reducing signal skew and improving signal integrity.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A semiconductor device having a plurality of bond pads comprising:
   a first series of bond pads arranged along a first portion of a first edge of a semiconductor device, the first series of bond pads generally aligned along a first axis, the first axis forming first angle α with the first edge of the semiconductor device; and
   a second serried of bond pads arranged along a second portion of the first edge of the semiconductor device, the first and second portions being adjacent, the second series of bond pads generally aligned along a second axis, the second axis forming second angle β with the first edge of the semiconductor device, wherein
   the first and second series of bond pads include all bond pads arranged along the first and second portions of the first edge of the semiconductor device, the first and second axes intersect, and further wherein no bond pad of first or second series is arranged between a bond pad of the other series and the first edge of the semiconductor device.

2. A semiconductor device according to claim 1, wherein:
at least one bond pad is in both the first series of bond pads and the second series of bond pads.

3. A semiconductor device according to claim 1, wherein:
no bond pad of the first series of bond pads is also in the second series of bond pads.

4. A semiconductor device according to claim 1, wherein:
the first angle α is approximately equal to the second angle β and the first series of bond pads and the second series of bond pads are arranged to approximate a "V" shape having a point and two legs.

5. A semiconductor device according to claim 4, wherein:
the point of the "V" shape is directed toward the first edge of the semiconductor device.

6. A semiconductor device according to claim 4, wherein:
the point of the "V" shape is directed away from the first edge of the semiconductor device.

7. A semiconductor device according to claim 1, wherein:
the first angle α is different than the second angle β and the first series of bond pads and the second series of bond pads are arranged to approximate an asymmetric "V" shape, the asymmetric "V" shape having a point and two legs.

8. A semiconductor package comprising:
a lead frame;
a semiconductor device according to claim 7; and
a plurality of bond wires extending between connection regions of the lead frame and the bond pads.

9. A semiconductor package according to claim 8, wherein:
the semiconductor device is mounted in a position offset from the approximate center of the lead frame in a direction along a longitudinal axis of the lead frame.

10. A semiconductor device according to claim 1, wherein:
the first angle α is approximately equal to the second angle β;
the first axis and second axis are substantially parallel; and
the first series of bond pads and the second series of bond pads are arranged to approximate a sawtooth shape.

11. A semiconductor package comprising:
a lead frame;
a semiconductor device according to claim 10; and
a first plurality of bond wires extending between a first plurality of connection regions on the lead frame and the first series of bond pads, and
a second plurality of bond wires extending between a second plurality of connection regions on the lead frame and the second series of bond pads.

12. A semiconductor package according to claim 11, wherein:
the first plurality of bond wires are of substantially equal length.

13. A semiconductor package comprising:
a semiconductor device, the semiconductor device having a plurality of bond pads, the plurality of bond pads comprising a first series of at least three bond pads, the first series of bond pads being generally aligned along a first axis, the first axis forming first angle α with a first edge of the semiconductor device and a second series of at least three bond pads, the second series of bond pads being generally aligned along a second axis, the second axis forming second angle β with the first edge of the semiconductor device; wherein the first series of bond pads and the second series of bond pads include all bond pads adjacent the first edge;

a lead frame, the lead frame including a plurality of connection regions, the connection regions be arranged substantially parallel to the first edge of the semiconductor device; and a plurality of bonding wires connecting the connection regions to corresponding ones of the first and second series of bond pads.

14. A semiconductor package according to claim 13, wherein:
the semiconductor device is configured as a pad-on-cell (POC) device that includes a memory cell array block and wherein
adjacent ones of the bond pads are arranged over the memory cell array block.

15. A semiconductor package according to claim 14, wherein:
the semiconductor device is configured as a pad-on-cell (POC) device that includes a plurality of memory cell array blocks separated by a plurality of sense amplifiers and wherein
adjacent ones of the bond pads are arranged over at least one memory cell array block.

16. A semiconductor package according to claim 15, wherein:
the bond pads are positioned outside a periphery of the sense amplifiers.

17. A semiconductor package comprising:
a semiconductor device having a plurality of bond pads, the plurality of bond pads comprising a first series of bond pads, the first series of bond pads being generally aligned along a first axis, the first axis forming first angle α with a first edge of the semiconductor device and a second series of bond pads, the second series of bond pads being generally aligned along a second axis, the second axis forming second angle β with the first edge of the semiconductor device; wherein
the semiconductor device is configured as a pad-on-cell (POC) device that includes a memory cell array block and further wherein
the first and second series of bond pads are arranged over the memory cell array block.

18. A semiconductor package comprising:
a semiconductor device having a plurality of bond pads, the plurality of bond pads comprising a first series of bond pads, the first series of bond pads being generally aligned alone a first axis, the first axis forming first angle α with a first edge of the semiconductor device and a second series of bond pads, the second series of bond pads being generally aligned along a second axis, the second axis forming second angle β with the first edge of the semiconductor device; wherein
the semiconductor device is configured as a pad-on-cell (POC) device that includes a plurality of memory cell array blocks and wherein
the first and second series of bond pads are arranged over the plurality of memory cell array blocks.

* * * * *